(12) United States Patent
Wong et al.

(10) Patent No.: US 11,005,494 B2
(45) Date of Patent: May 11, 2021

(54) CURRENT STEERING DIGITAL-TO-ANALOG CONVERSION SYSTEMS

(71) Applicant: Jariet Technologies, Inc., Redondo Beach, CA (US)

(72) Inventors: Ark-Chew Wong, Irvine, CA (US); Richard Dennis Alexander, Lake Forest, CA (US)

(73) Assignee: Jariet Technologies, Inc., Redondo Beach, CA (US)

( * ) Notice: Subject to any disclaimer, the term of this patent is extended or adjusted under 35 U.S.C. 154(b) by 0 days.

(21) Appl. No.: 16/937,453

(22) Filed: Jul. 23, 2020

(65) Prior Publication Data

US 2020/0358452 A1 Nov. 12, 2020

Related U.S. Application Data

(63) Continuation of application No. 16/477,180, filed as application No. PCT/US2017/067386 on Dec. 19, 2017, now Pat. No. 10,771,086.

(Continued)

(51) Int. Cl.
*H03M 1/66* (2006.01)
*H03M 1/74* (2006.01)
(Continued)

(52) U.S. Cl.
CPC .............. *H03M 1/742* (2013.01); *H03M 1/00* (2013.01); *H03M 1/0646* (2013.01); *H03M 1/66* (2013.01); *H03M 1/80* (2013.01)

(58) Field of Classification Search
CPC ........ H03M 1/66; H03M 1/0646; H03M 1/00; H03M 1/80
(Continued)

(56) References Cited

U.S. PATENT DOCUMENTS 6,977,602 B1 12/2005 Ostrem et al.
7,977,984 B1 7/2011 D'Souza et al.
(Continued)

FOREIGN PATENT DOCUMENTS

WO WO 2007/021863 2/2007
WO WO 2017/173118 10/2017

OTHER PUBLICATIONS

Extended European Search Report from European Patent Application No. 17891123.6, dated Oct. 6, 2020, 11 pages.

*Primary Examiner* — Joseph J Lauture
(74) *Attorney, Agent, or Firm* — Morgan, Lewis & Bockius LLP

(57) ABSTRACT

A DAC driver includes a number of DAC drivers coupled to a load network. A first DAC driver includes a first set of data switches that can be controlled by a first digital input signal. The first DAC driver further includes a first set of output switches, a first set of dump switches and a first set of current sources. Another DAC driver includes a second set of output switches, dump switches, and current sources. The first set of output switches or the second set of output switches are operable to respectively couple either one of the first set of data switches or the first set of current sources to the load network. The first set of dump switches or the second set of dump switches are operable to respectively dump the first set of current sources or the second set current sources into a respective dump load.

20 Claims, 12 Drawing Sheets

Related U.S. Application Data

(60) Provisional application No. 62/445,678, filed on Jan. 12, 2017.

(51) Int. Cl.
    *H03M 1/06*     (2006.01)
    *H03M 1/80*     (2006.01)
    *H03M 1/00*     (2006.01)

(58) Field of Classification Search
    USPC .......................... 341/144, 154, 145, 153, 150
    See application file for complete search history.

(56) References Cited

U.S. PATENT DOCUMENTS

| | | |
|---|---|---|
| 9,413,394 B1 | 8/2016 | Lye et al. |
| 9,419,636 B1 | 8/2016 | Graham et al. |
| 10,771,086 B2 * | 9/2020 | Wong .................... H03M 1/742 |
| 2007/0001888 A1 | 1/2007 | Draxelmayr |
| 2009/0085782 A1 | 4/2009 | Felder et al. |
| 2010/0328124 A1 | 12/2010 | O'Donnell et al. |

* cited by examiner

CURRENT STEERING DIGITAL-TO-ANALOG CONVERSION SYSTEMS

CROSS-REFERENCE TO RELATED APPLICATIONS

This application is a continuation of application Ser. No. 16/477,180, filed on Jul. 10, 2019, now U.S. Pat. No. 10,771,086, which is the national phase of International Application No. PCT/US2017/067386, filed on Dec. 19, 2017, which claims the benefit of U.S. Provisional Patent Application No. 62/445,678, filed on Jan. 12, 2017, the entirety of each of which is incorporated herein by reference for all purposes.

TECHNICAL FIELD

The present description relates in general to digital-to-analog conversion systems, and more particularly to, for example, without limitation, current steering digital-to-analog conversion systems.

BACKGROUND

Digital-to-analog converter (DAC) circuits are commonly used to convert digital signals to analog signals. Example applications of DAC circuits are in communication devices and systems. For instance, almost all communication devices such as hand-held communication devices including smart phones, tablets, phablets, and other communication devices employ one or more DAC circuits. DAC circuits are characterized by properties such as resolution, accuracy, and maximum sampling frequency, and can be implemented in integrated circuits based on a number of different architectures.

The description provided in the background section should not be assumed to be prior art merely because it is mentioned in or associated with the background section. The background section may include information that describes one or more aspects of the subject technology.

Figure 1:
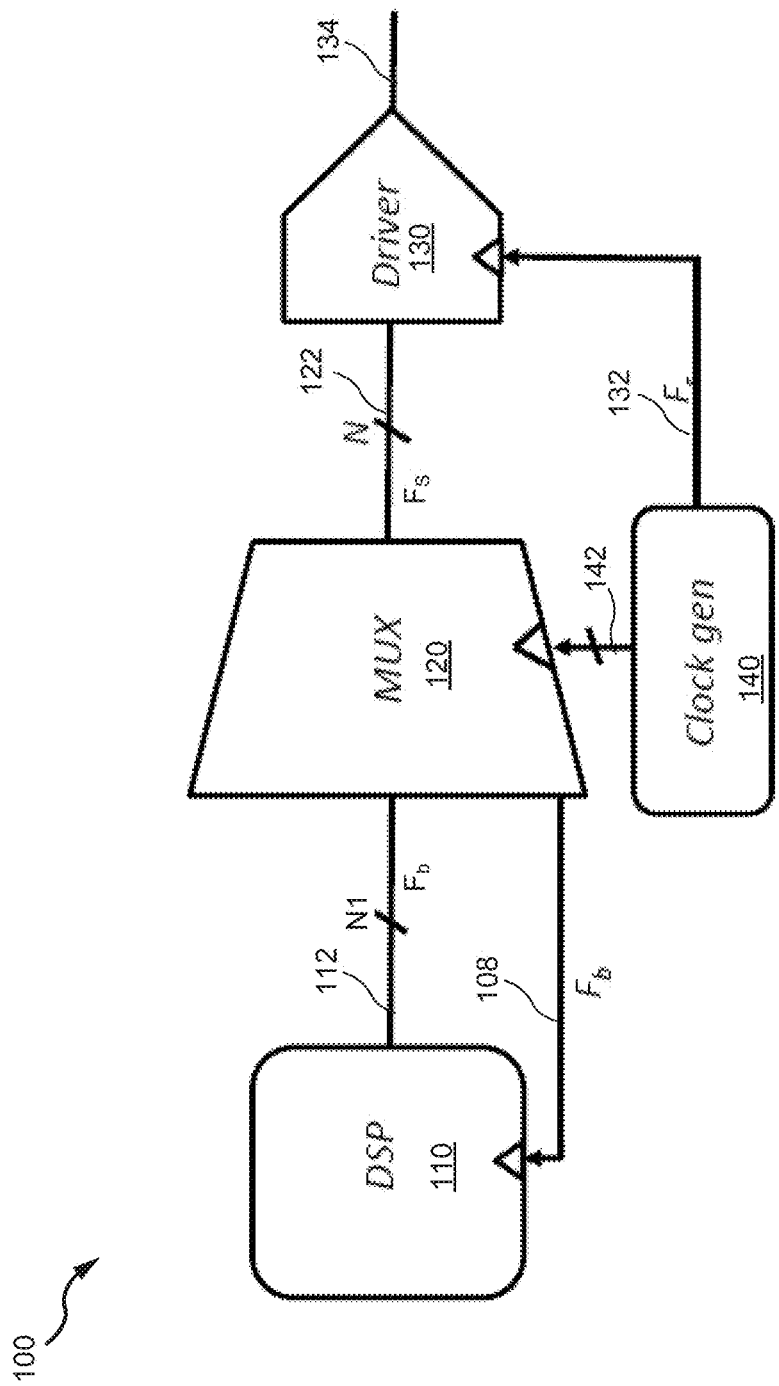
FIG. 1 is a block diagram illustrating an example of a digital-to-analog conversion (DAC) system.

In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

DETAILED DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive.

In one or more implementations, the subject technology provides a current steering digital-to-analog conversion (DAC) system with an interleaved and folded architecture. Such a current steering DAC system may be referred to as an interleaved folded current steering DAC system. The current steering DAC system may be composed of two or more folded current steering DACs. The folded current steering DACs may be referred to as folded current steering DAC drivers or folded current steering DAC sub-drivers. Outputs of the DAC drivers are summed at an output of the DAC system by a load network (e.g., a load resistive network) through selection switches. Each individual DAC driver includes a respective dump network (e.g., a dump resistive network).

In an aspect, the current steering DAC system may be an interleave by 2 folded DAC system, in which two DAC drivers are employed. The DAC drivers may be denoted as DAC-A and DAC-B. During a first operational phase, one of the two DAC drivers (e.g., DAC-A) steers current into the output at the load network, while the other DAC (e.g., DAC-B) steers the current into the dump network (e.g., DAC-B's dump network). On a next phase of operation, DAC-A steers its current to the dump network (e.g., DAC-A's dump network), and DAC-B steers its current to the load network. In this manner, neither of the DAC currents (e.g., current from DAC-A, current from DAC-B) are truly turned off, allowing high-speed operation.

The subject technology may provide high-speed (e.g., >10 GHz) DAC driver circuits that reduce or avoid effects pertaining, for instance, to power issues, headroom issues, and/or breakdown issues. Breakdown issues may be common in deep submicron designs for example. The subject technology may allow forming high-speed DACs that may achieve higher sampling rates using a lower power supply for power savings. In an aspect, the interleaved architecture may allow high-speed operation. In an aspect, the folded architecture can alleviate supply headroom issues common in current steering DAC systems. In an aspect, interleaving switches utilized in the interleaved architecture can be implemented in a folded cascode manner, which may alleviate a risk associated with time-dependent dielectric breakdown (TDDB) issues. In one or more aspects, the terms architecture, topology, and configuration may be used interchangeably.

FIG. 1 is a block diagram illustrating an example of a DAC system 100. The DAC system 100 includes a digital signal processor circuit (DSP) 110, a multiplexer (MUX) circuit 120, a clock generation circuit 140, and a DAC driver circuit 130. The MUX circuit 120 is an up-sampler and is utilized to convert a digital baseband signal 112 of the DSP 110 entering the MUX at a first rate ($F_b$, e.g., 500 MHz) to a digital signal 122 at a higher rate ($F_s$, e.g., 32 GHz). The digital baseband signal 112 may be provided via N1 data lines that are converted to N (>N1) data lines by the MUX circuit 120. In some aspects, N can be equal or larger than the number of actual bits of the digital signal 122, depending on the DAC architecture. The MUX circuit 120 operates based on a number of clock signals 142 of the clock generator circuit 140. The clock generator circuit 140 generates a sampling clock signal 132 at a sampling rate $F_s$ (e.g., 10 GHz) and a number of clock signals 142 at fractions of the sampling rate $F_s$. The DSP 110 receives a trigger clock signal 108 at a frequency (e.g., a baud rate $F_b$), from the MUX circuit 120. The frequency of the trigger clock signal 108 is normally equal to the lowest frequency of the clock signals 142. The DSP 110 presents the digital baseband signal 112 to the MUX circuit 120 at a rate equal to the trigger clock signal 108 (e.g., $F_b$).

The sampling rate ($F_s$) of the DAC driver circuit 130 can be set by the sampling clock signal 132 of the clock generator circuit 140. In an aspect, the relation between N1 and N can be expressed as N1=N ($F_s/F_b$). The DAC system 100 may generate an analog signal 134 based on the digital signal 122. For instance, the DAC system 100 may convert the digital signal 122 into an analog representation of bits of the digital signal 122. In an aspect, the analog signal 134 may be output from the DAC driver circuit 130 for use by another circuit, for example, an amplifier or a filter.

Figure 2:
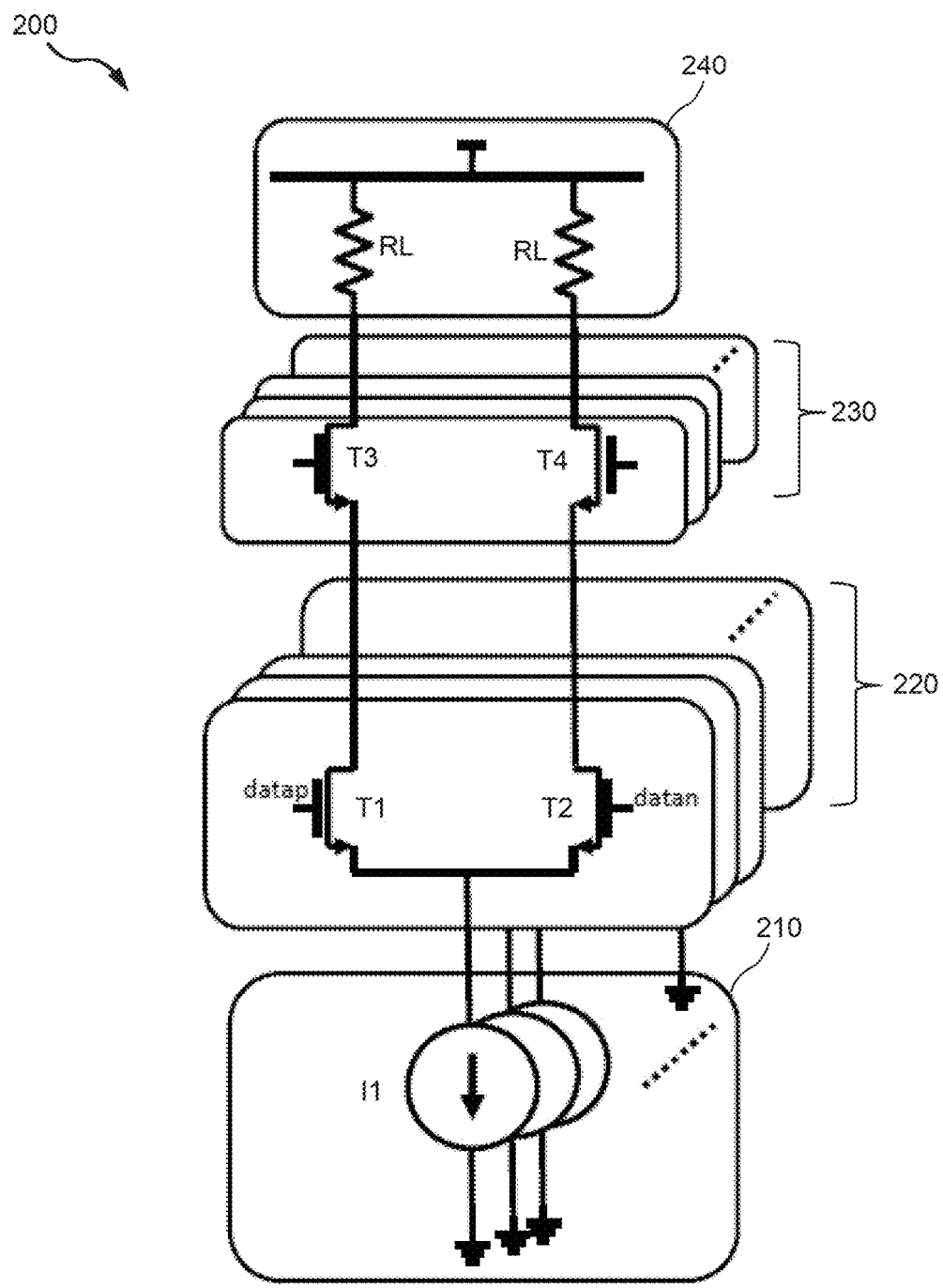
FIG. 2 is a schematic diagram illustrating an example of a current steering DAC driver circuit.

FIG. 2 is a schematic diagram illustrating an example of a current-steering DAC driver circuit 200. In an aspect, the current-steering DAC driver circuit 200 may be referred to as a current-mode DAC driver circuit, a straight common-mode logic-based (CML-based) current-steering DAC driver circuit, an I-DAC driver circuit, or a variant thereof (e.g., CML-based DAC driver circuit). The current-mode DAC driver circuit 200 may be utilized as the DAC driver circuit 130 in FIG. 1. Various components of the current-steering DAC driver circuit 200 are stacked. The current-mode DAC driver circuit 200 may include tail current sources 210, sets of data switches 220 and sets of cascode devices 230. The sets of cascode devices 230 may be connected to a load network 240. The load network 240 may be a resistive load network that includes load resistors such as RL. In some aspects, the load network 240 may further include reactive components (not shown), such as capacitances and inductances. In one aspect, the load network 240 may include one or more transistor devices. The load network 240 is coupled between a voltage source VDD and the cascode devices 230. In an aspect, an output of the current-steering DAC driver circuit 200 may be derived from connection nodes between the load network 240 and the sets of cascode devices 230. The cascode devices 230 may be referred to simply as cascode 230. The tail current sources 210 form a tail current array coupled in parallel to a ground potential.

Each set of data switches 220 may include at least one pair of data switches. The data switches that form each set of data switches may be transistor devices, for example, metal-oxide-semiconductor (MOS) transistors T1 and T2 such as NMOS transistors. One of the data switches (e.g., T1) in each set may receive a datap (Dp) signal at a terminal (e.g., a gate terminal) and the other of the data switches (e.g., T2) in each set may receive a datan (Dn) signal. The Dp and Dn signals may be generated based on (e.g., derived from) the N bits received by the DAC driver circuit 200. In an aspect, the Dp signal and the Dn signal are complementary signals. For example, when the Dp signal is in a high state (e.g., higher voltage, logic high, or '1' state), the Dn signal is in a low state associated with a lower voltage (e.g., lower voltage, logic low, or '0' state). In some cases, a data switch (e.g., T1 or T2) is turned off when the applied data signal (e.g., Dp or Dn) is in the low state and is turned on when the applied data signal is in the high state, or vice versa. Each set of the various sets of data switches may be connected to one of the tail current sources (e.g., I1) that form the tail current array 210 and one of the sets of cascode devices 230. In an aspect, the current-steering DAC driver circuit 200 includes N sets of two data switches (e.g., 2N individual data switches), N sets of cascode devices (e.g., 2N individual cascode devices), and N tail current sources. In an aspect not shown in FIG. 2, each set of the various sets of data switches may be connected to a same common pair of cascode devices.

As used herein, transistor devices, which may be utilized in the tail current sources 210, cascode devices 230, and/or the data switches 220, may be or may include MOS transistor devices, such as metal-oxide-semiconductor field effect transistor (MOSFET) devices. In FIG. 2, the data switches (e.g., T1 and T2) and the cascode devices (e.g., T3 and T4) may be or may include N-type MOS (NMOS) devices. In an aspect, the tail current sources may be or may include NMOS devices.

Figure 3A:
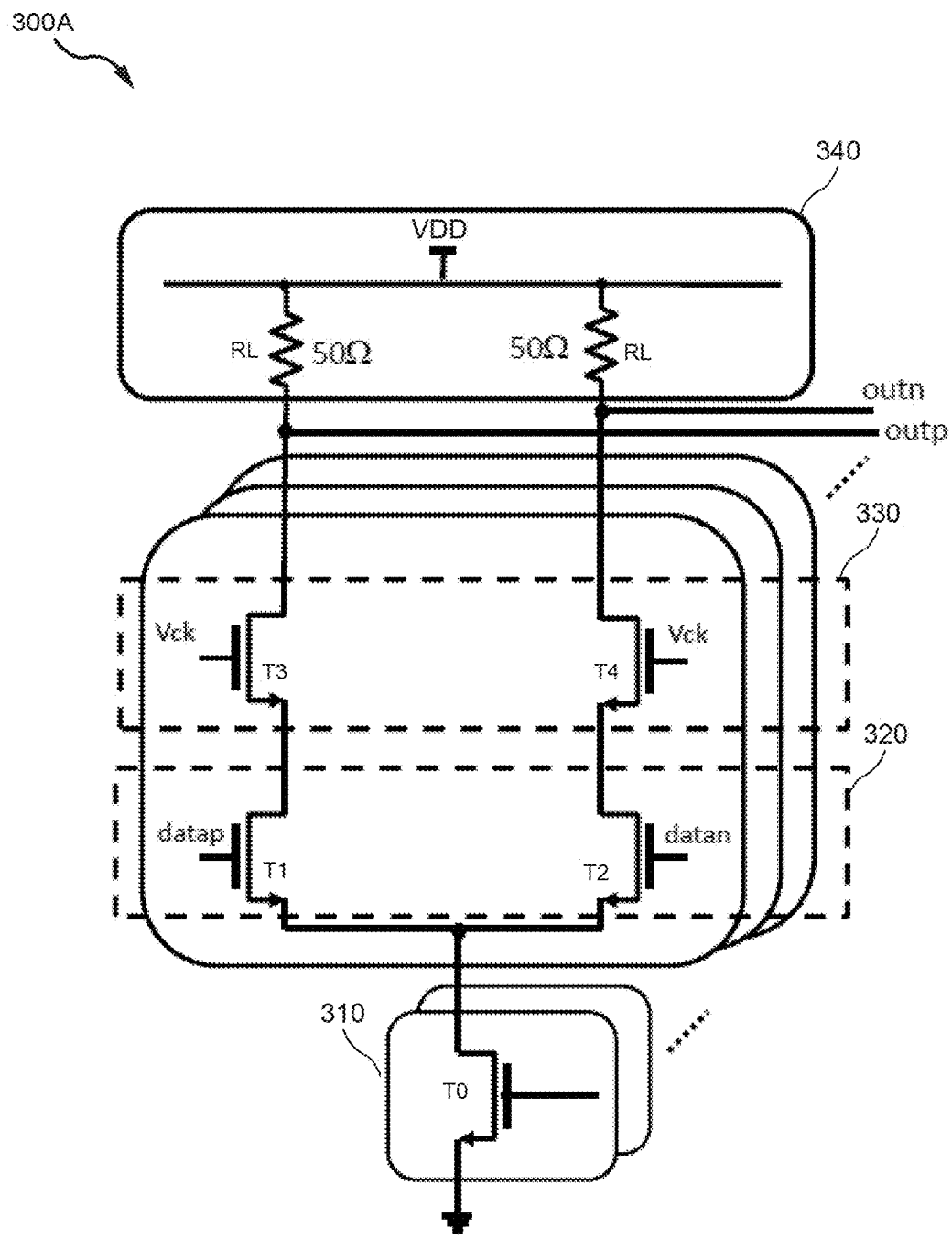
FIG. 3A is a schematic diagram illustrating an example of a current steering DAC driver circuit.

FIG. 3A is a schematic diagram illustrating an example of a current steering DAC driver circuit 300A. The current steering DAC driver circuit 300A may be referred to as a single folded current steering DAC driver circuit. The current steering DAC driver circuit 300A may be utilized as the DAC driver circuit 130 of FIG. 1. The description from FIG. 2 generally applies to FIG. 3A, with examples of differences between FIG. 2 and FIG. 3A and other description provided herein for purposes of clarity and simplicity.

The current steering DAC driver circuit 300A includes a load network 340, sets of cascode devices 330, sets of data switches 320, and tail current sources (or tail current arrays) 310. In one or more aspects, the number of sets of data switches 320 is the same as the number of sets of cascode devices 330, and the number of sets of data switches 320 is the same as the number of tail current sources 310. The output of the current steering DAC driver circuit 300 is represented by outn and outp. The load network 340 may a resistive load network that includes load resistors RL (e.g., 50Ω resistors). Each tail current source 310 may be, or may include, a transistor device T0. Each set of two data switches 320 (e.g., transistors T1 and T2) is connected to a respective set of two cascode devices 330 (e.g., transistors T3 and T4) and a respective tail current source 310 (e.g., transistor T0). In this regard, each data switch (e.g., T1 or T2) in each set is serially connected to one cascode device (e.g., T3 and T4). One of the data switches (e.g., T1) of the set of data switches 320 may receive a datap (Dp) signal at a terminal (e.g., a gate terminal) and the other data switch (e.g., T2) of the data switches 320 in each set may receive a datan (Dn) signal.

The Dp and Dn signals may be generated based on (e.g., derived from) the N bits received by the DAC driver circuit 300. In an aspect, the Dp signal and the Dn signal are complementary signals. All sets of two cascode devices may be connected to the one common load network. A gate terminal of the cascode devices (e.g., T3 and T4) may be biased with a clock voltage $V_{ck}$. In an aspect, the single folded current steering DAC driver circuit 300A includes N sets of two cascode devices, N sets of two data switches, and N tail current sources. Where N is the number of input data lines of the current-steering DAC driver circuit 200.

In an aspect, the cascode devices, data switches, and tail current sources may be, or may include, thin-oxide devices (e.g., thin oxide transistor devices). In some cases, the thin-oxide devices may have an oxide thickness of a few angstroms (e.g., 0.5 Å to 10 Å). The breakdown voltage associated with the thin-oxide devices may be between around 0.9 V and 1.0 V. In some cases, the breakdown voltage of the thin-oxide devices is between 0.94 V and 0.96 V (e.g., 0.95 V).

Figure 3B:
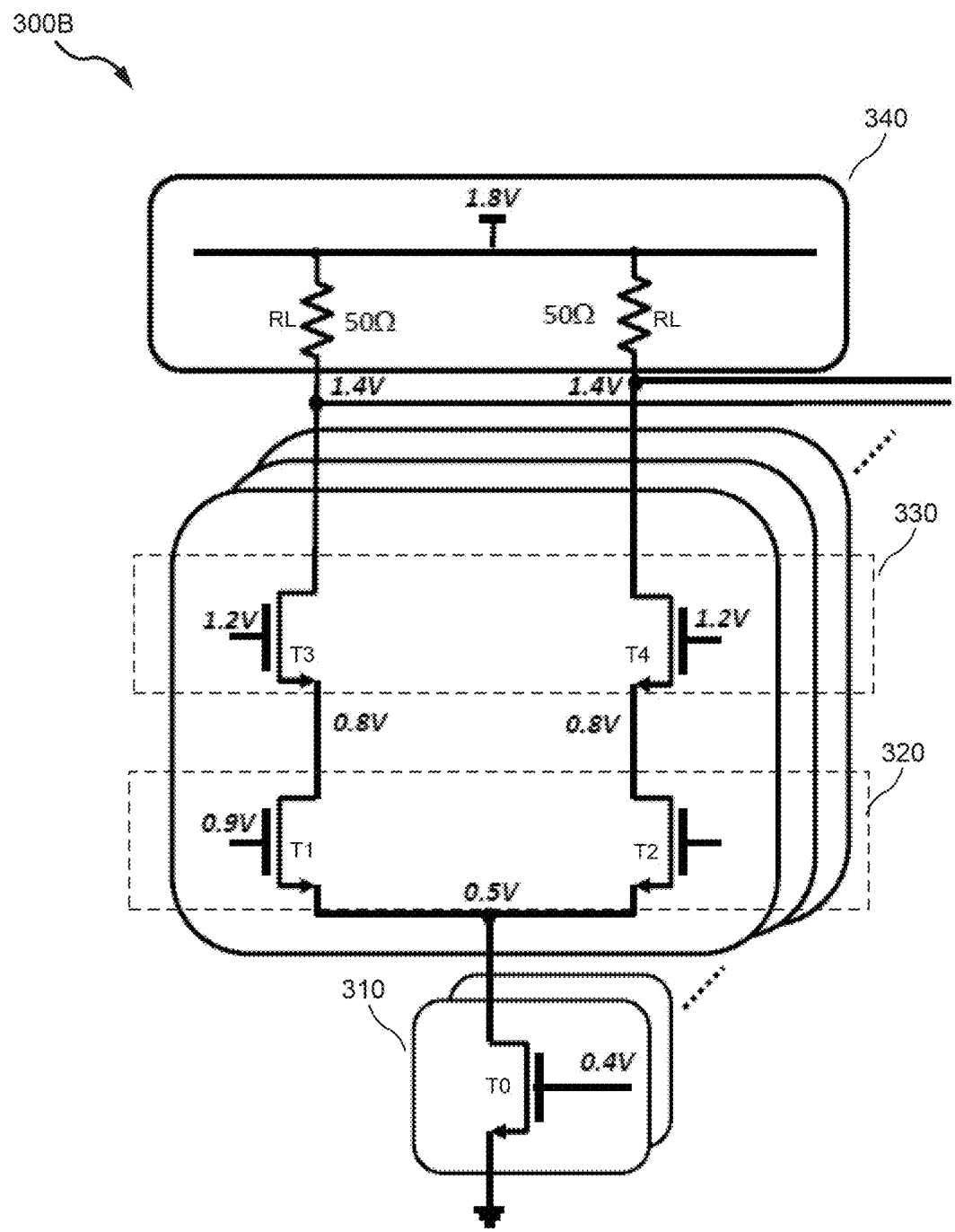
FIG. 3B is a schematic diagram illustrating examples of voltages associated with the current steering DAC driver circuit of FIG. 3A.

FIG. 3B is a schematic diagram illustrating examples of voltages associated with the current steering DAC driver circuit 300A of FIG. 3A. It is noted that FIG. 3B illustrates one example set of voltages. Other voltages may be associated with the current steering DAC driver circuit 300A of FIG. 3A. For example, in FIG. 3B, bias voltages applied to the cascode devices 330 and the tail current sources 310 are 1.2 V and 0.4 V, respectively. Larger bias voltages may be applied to the cascode devices 330 than to the tail current sources and to the data switches 320 since the terminals (e.g., source and drain terminals) of the cascode devices 330 are at higher potential than terminals of the tail current sources 310 and the data switches 320. Other bias voltages may be utilized depending on performance characteristics/requirements, applications, etc. associated with the current steering DAC driver circuit 300A. In cases in which thin-oxide devices are utilized in the cascode devices 330, the 1.2 V bias voltage may cause gate dielectric breakdown of the thin-oxide devices.

Figure 4:
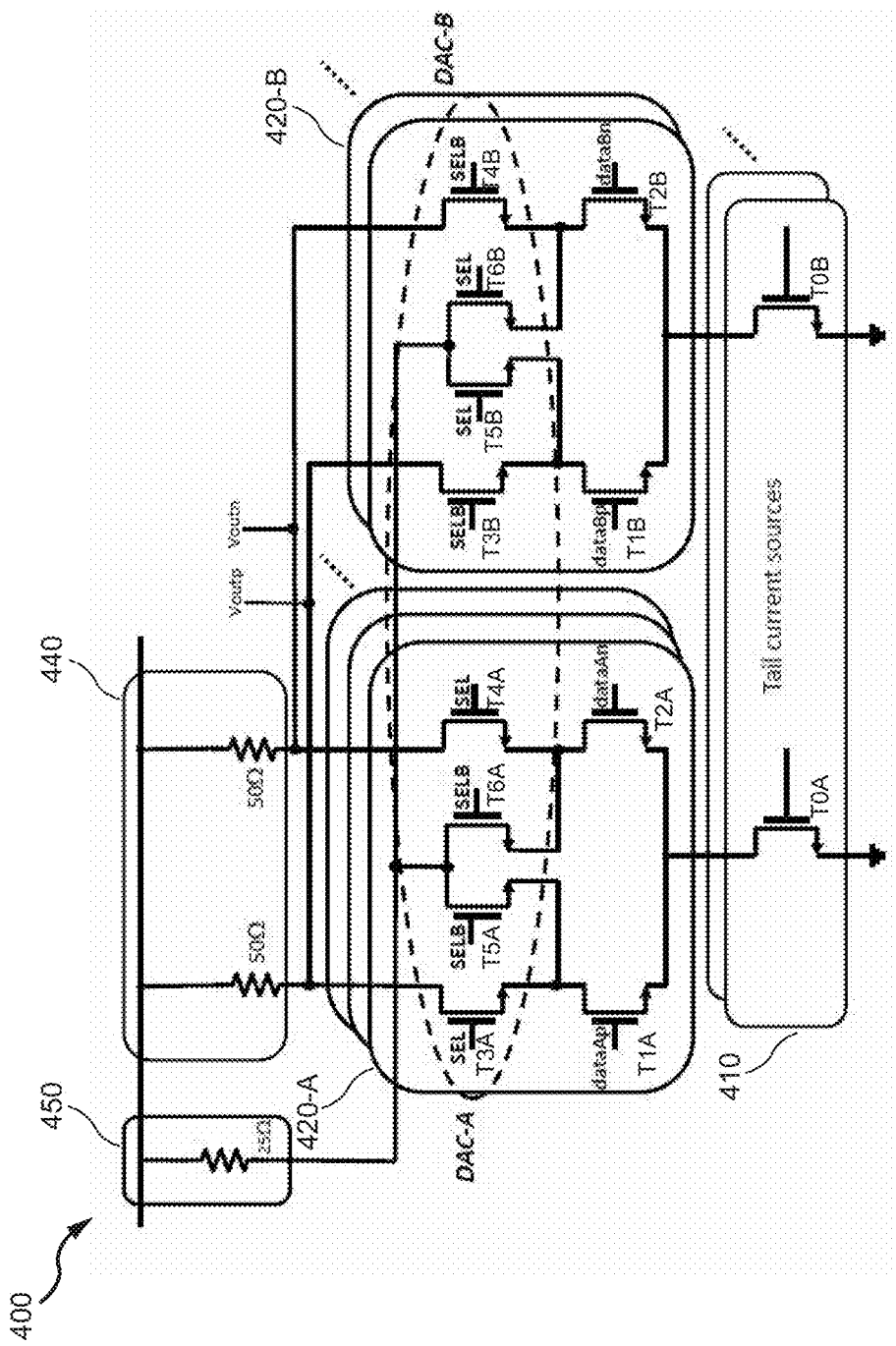
FIG. 4 is a schematic diagram illustrating an example of a current steering DAC driver.

FIG. 4 is a schematic diagram illustrating an example of a current steering DAC driver 400. The current steering DAC driver 400 may be utilized as the DAC driver circuit 130 of the DAC system 100 in FIG. 1. In an aspect, the current steering DAC driver 400 may be referred to as an interleaved current steering DAC driver. The current steering DAC driver 400 includes a load network 440, a dump network 450, a DAC driver 420-A (DAC A), a DAC driver 420-B (DAC B), and tail current sources 410. DAC driver 420-A and DAC driver 420-B may be referred to as sub-drivers. DAC driver 420-A and DAC driver 420-B include respective unit cells. The number of unit cells in DAC driver 420-A may equal the number of unit cells in DAC driver 420-B. Each unit cell includes data switches and cascode devices. In FIG. 4, each unit cell of DAC driver 420-A is a differential cell and includes two data switches (e.g., transistors T1A and T2A) and four cascode devices (e.g., transistors T3A, T4A, T5A and T6A), and similarly each unit cell of DAC driver 420-B is a differential cell and includes two data switches (e.g., transistors T1B and T2B) and four cascode devices (e.g., transistors T3B, T4B, T5B and T6B). Two of the cascode devices (e.g., T3A and T4A) from each unit cell may be connected to the load network 440 and the other two of the cascode devices (e.g., T5A and T6A) may be connected to the dump network 450. Each unit cell of the DAC driver 420-A is coupled through its respective tail transistor (TOA) of the current source 410 to the ground potential. Similarly, each unit cell of the DAC driver 420-B is coupled through its respective tail transistor (TOB) of the current source 410 to the ground potential. In an aspect, the current steering DAC driver circuit includes N unit cells for DAC driver 420-A, N unit cells for DAC driver 420-B, and N tail current sources. Where N is number of input data lines of the current-steering DAC driver 400.

For DAC driver 420-A, the data switch T1A may receive a dataAp signal at a gate terminal of the data switch T1A, and the data switch T2A may receive a dataAn signal. The dataAp and dataAn signals may be complementary to each other. For DAC driver 420-B, the data switch T1B may receive a dataBp signal at a gate terminal and the other of the data switch T2B may receive a dataBn signal. The dataBp and dataBn signals may be complementary to each other. The dataAp, dataAn, dataBp and dataBn signals may be based on the N bits received by the current steering driver 400. The combination of the two signal sets dataAp/dataAn and dataBp/dataBn are used to form the desired differential analog signal provided to the load network 440.

The cascode devices in each unit cell may be on or off depending on the clock phases SEL and SELB. The clock phases SEL and SELB may be referred to as selection signals or interleaving clock signals. The clock phases SEL and SELB are complementary to one another such that when one is in a high state (logic "1"), the other is in a low state (logic "0"). For DAC driver 420-A, when the clock phase SEL is in the high state (i.e., the clock phase SELB is in the low state), the cascode devices T3A and T4A biased by the clock phase SEL are switched on and can tie the data switches T1A and T2A to the load network 440, whereas the cascode devices T5A and T6A biased by the clock phase SELB are switched off and do not connect the data switches T1A and T2A to the dump network. In this aspect, for DAC driver 420-B, the cascode devices T5B and T6B biased by the clock phase SELB are switched off and do not tie the data switches T1B and T2B to the load network 449, whereas the cascode devices T5B and T6B biased by the clock phase SEL are switched on and can tie the data switches to the dump network 450. DAC driver 420-A is referred to as being active and DAC driver 420-B is referred to as being inactive in the above scenario (SEL is high and SELB is low). In this regard, the current from DAC driver 420-A is steered to the load network, and the output of the current steering DAC driver 400 is based on the current from DAC driver 420-A. In contrast, when the clock phase SEL is in the low state (i.e., the clock phase SELB is in the high state), DAC driver 420-A is inactive and DAC driver 420-B is active. In this case, the current from DAC driver 420-B is steered to the load network, and the output of the current steering DAC driver 400 is based on the current from DAC driver 420-B.

Figure 5A:
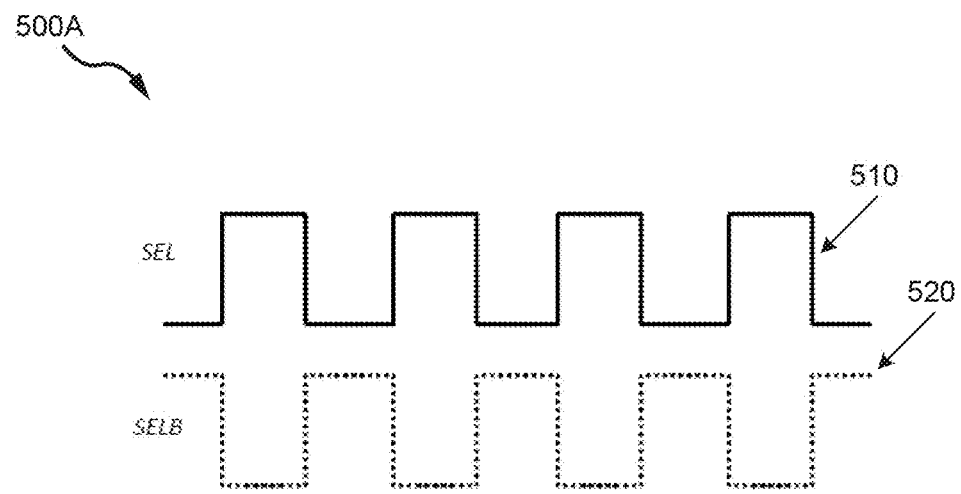
FIG. 5A is a timing diagram illustrating examples of clock pulses representing clock phases SEL and SELB of FIG. 4.

FIG. 5A is a timing diagram 500A illustrating examples of clock pulses 510 and 520 representing clock phases SEL and SELB of FIG. 4. In some aspects, the clock pulses 510 and 520 are complementary voltage signals. As an example, in a high state, the clock pulses 510 and 520 may have a voltage level within a range of about 0.8 V-1.0 V, and, in the low state, the clock pulses 510 and 520 may have a voltage level of about 0 V. In FIG. 5A, the clock pulses 510 and 520 each spend half the time in the high state and the other half of the time in the low state.

Figure 5B:
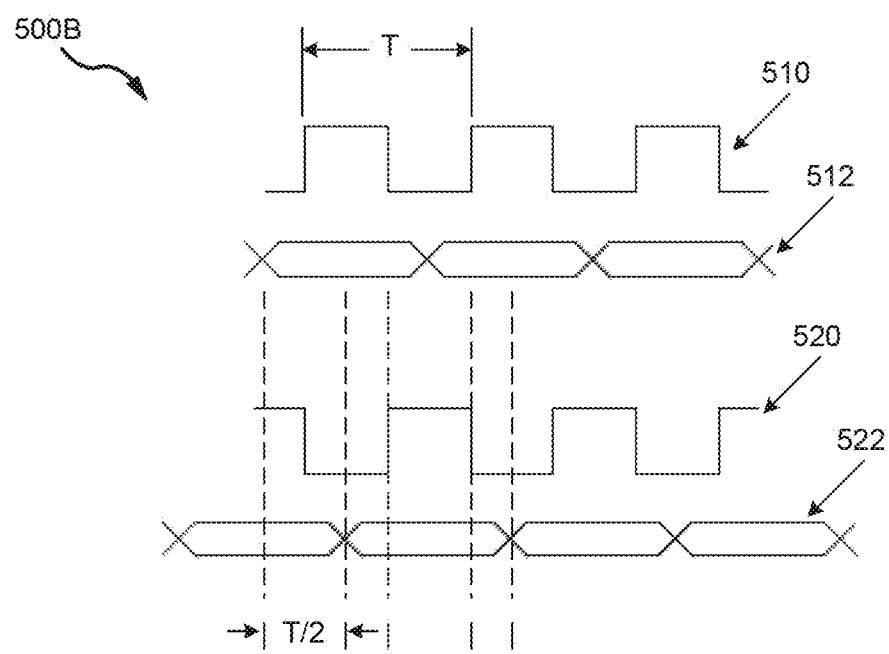
FIG. 5B is a timing diagram illustrating examples of the clock pulses and respective data applied to the data switches of FIG. 4.

FIG. 5B is a timing diagram 500b illustrating examples of the clock pulses 510 and 520 and respective data 512 and 522 applied to the data switches of FIG. 4. The clock pulses 510 and 520 representing clock phases SEL and SELB FIG. 4 and the data 512 and 522 may respectively represent dataAp, dataAn for DAC driver 420-A and dataBp, dataBn for DAC driver 420-B of FIG. 4. The data 512 and 522 are applied to the data switches of DAC driver 420-A and DAC driver 420-A in accordance with the clock pulses 510 and 520. For example, 512 may be applied to the data switches T1A and T2A of DAC driver 420-A in accordance with the clock pulse 510, and 522 may be applied to the data switches T1B and T2B of DAC driver 420-B in accordance with the clock pulse 520. In FIG. 5B, the interleaving may be operated at 32 GHz for 64 giga samples per second (Gs/s) data. Thus, a corresponding period T (e.g., edge to edge) of the clock pulses 510 and 520 is about 31.25 ps. Other interleaving frequencies may be utilized depending on application. In an aspect, the clock pulses 510 and 520 and the data 512 applied to the data switches of the DAC driver 420-A are offset in time by half of the period T (e.g., T/2=15.625 ps) relative to the data 522 applied to the data switches of the DAC driver 420-B.

Although FIGS. 5A and 5B are described with reference to the current steering DAC driver 400 of FIG. 4, FIGS. 5A and 5B may also be utilized with respect to, for example, the current steering DAC drivers 700 and 800 of FIGS. 7 and 8.

For low-speed or medium-speed applications, a structure with a single DAC driver (e.g., no sub-drivers) such as DAC driver circuit 300 of FIG. 3 may be utilized. In such applications, the cascode devices may be implemented using thick-oxide devices with little or no penalty on bandwidth (BW) or TDDB. For high-speed applications (e.g., frequencies greater than 30 GHz), two or more DAC sub-drivers may be utilized to facilitate the high-speed operation. In an aspect, in the interleaving mode of operation, the voltage signal $V_{ck}$ of FIG. 3 applied to the gate of transistors T3 and T4 is a clock signal that swings around 1.0 V±0.3 V (e.g., within a range of about 0.7 V to 1.3 V). The elevated gate voltage (e.g., greater than 0.945 V) of $V_{ck}$ may potentially be dangerous to the lifetime and reliability of a device (e.g., the cascode device T3 and T4). For example, the elevated gate voltage may limit the lifetime of the device due to TDDB and/or voltage breakdown. In some cases, the elevated gate voltage of $V_{ck}$ may prevent utilization of thin-oxide devices in advanced deep submicron complementary-MOS (CMOS) nodes as cascode devices for high-speed applications (e.g., interleaving topologies). In an aspect, in interleaving DACs, it may be difficult to implement trickle/bleed currents without incurring more parasitic capacitances. The parasitic capacitances may degrade spurious-free dynamic range (SFDR). In an aspect, a configuration in which components are stacked (e.g., serially-connected transistors) may present headroom issues. The headroom issue can be addressed by using a folded configuration, as shown and described herein with respect to FIG. 6 below.

Figure 6:
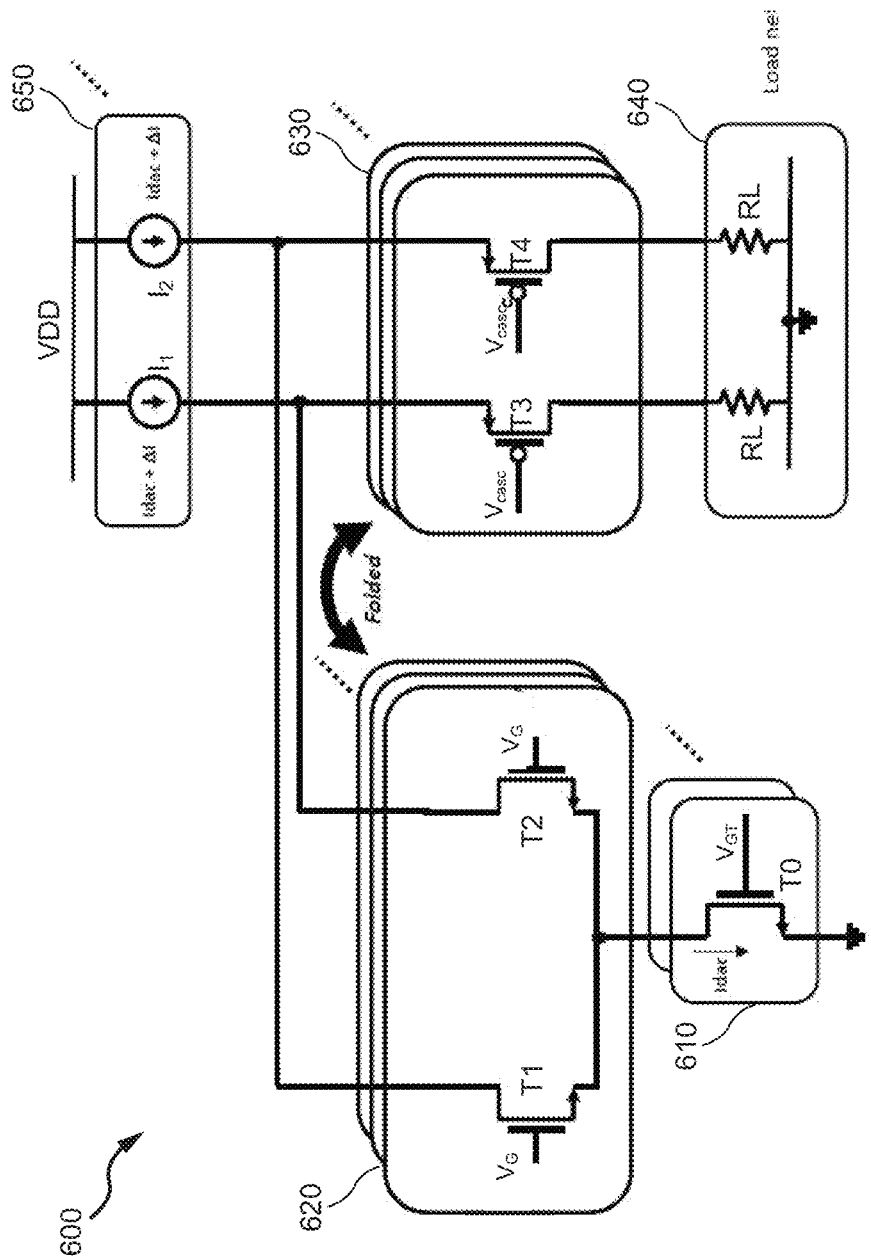
FIG. 6 is a schematic diagram illustrating an example of a folded current steering DAC driver.

FIG. 6 illustrates a schematic diagram of an example of a folded current steering DAC driver 600. The current steering DAC driver 600 may be utilized as the DAC system 100 in FIG. 1. The folded current steering DAC driver may be referred to as a folded DAC driver. The folded current steering DAC driver 600 includes sets of data switches 620, tail current sources 610, sets of cascode devices 630, a load network 640 and sets of second current sources 650. While not shown in detail in the FIG. 6, for the purpose of brevity, the number of sets of data switches is equal to the number of sets of cascode devices 630, is equal to the number of tail current sources 610, and is equal to the number of sets of second current sources 650. Each set of cascode devices 630 includes two cascode devices T3 and T4. The sets of data switches 620 are in a folded configuration relative to the sets of cascode devices 630. In an aspect, each set of data switches 620 includes two data switches T1 and T2 tied to a respective set of cascode devices 630, a respective tail current source 610, and a respective set of second current sources 650. The sets of cascode devices are tied to the common load network 640. In an aspect, the current steering DAC driver circuit 600 includes N sets of data switches, N sets of cascode devices, N tail current sources, and N sets of second current sources, where N is the number of input lines of the folded current steering DAC driver 600.

The folded configuration of FIG. 6 may allow lower bias voltages to be applied to various components. For instance, a gate voltage supply of about 0.9 V may be applied to bias devices utilized in the data switches T1 and T2 (e.g., as VG), the cascode devices T3 and T4 (e.g., as Vcasc) and/or the tail current courses device T0 (e.g., VGT). This allows implementing these devices by using thin-oxide devices (e.g., transistors). It is to be noted that the thin-oxide devices used in the folded configuration of FIG. 6 are not stacked. The folded configuration may help avoid or reduce a headroom issue, avoid or reduce level shifting in the interleaving clock signals (e.g., SEL and SELB), avoid or reduce effects of TDDB, and/or avoid or reduce a need for external direct current (DC) blocking capacitors. Further, the folded configuration may enable a good power supply rejection (PSR).

Figure 7:
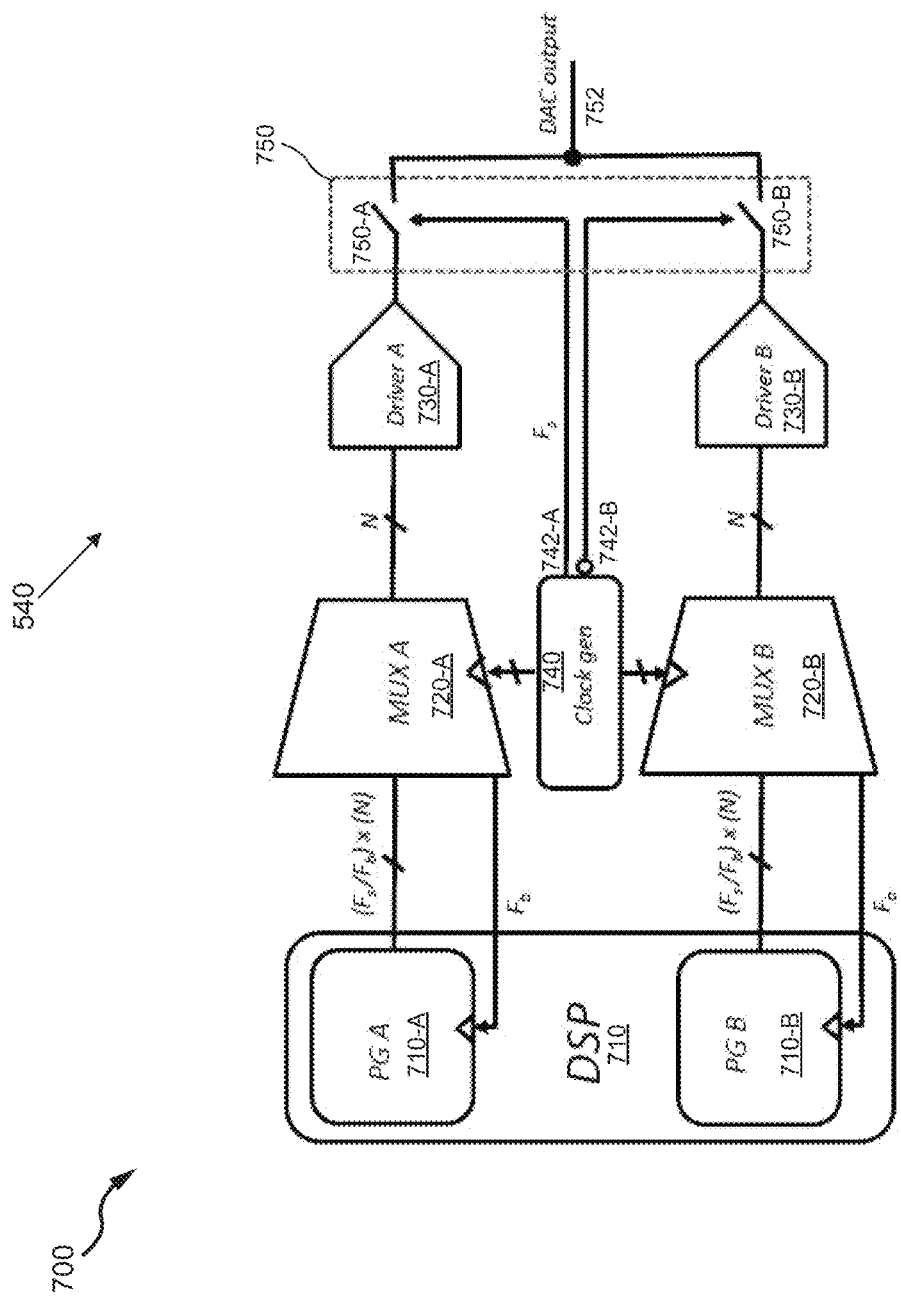
FIG. 7 is a block diagram illustrating an example of a DAC system including an interleaved current steering DAC driver.

FIG. 7 is a block diagram illustrating an example of a DAC system 700 that includes an interleaved current steering DAC driver. The DAC system 700 includes a DSP 710, a first multiplexer circuit 720-A (denoted as MUX A), a second multiplexer circuit 720-B (denoted as MUX B), a clock generation circuit 740, a first current DAC sub-driver 703-A (denoted as Driver A), a second current DAC sub-driver 730-B (denoted as Driver B), and an interleaver circuit 750. The sub-drivers may also be referred to as interleave DAC sub-drivers. The number of sub-drivers (e.g., 2 in FIG. 7) may be referred to as the interleaving factor.

The DSP 710 includes a first pattern generation circuit 710-A (denoted as PG A) and a second pattern generation circuit 710-B (denoted as PG B). Each of the multiplexer circuits 720-A and 720-B may generate N bits based on the output of the first pattern generation circuit 710-A and the second pattern generation circuit 710-B, respectively. The DAC system 700 may generate a DAC analog output signal 752 based on the N bits provided by MUX A and MUX B. The DAC sub-drivers 730-A and 730-B may be interleaved with one another by the interleaver circuit 750. The interleaver circuit 750 includes switches 750-A and 750-B controlled by complementary clock signals 742-A and 742-B generated the clock generation circuit 740. In an aspect, the interleaver circuit 750 refers to components (e.g., devices) and/or architectures that form DAC sub-drivers 730-A and 730-B. Depending on the state (e.g., on or off state) of the switches 750-A and 750-B of the interleaver circuit 750, the DAC output 752 may be the output from the DAC sub-drivers 730-A or the output from the DAC sub-drivers 730-B.

Figure 8A:
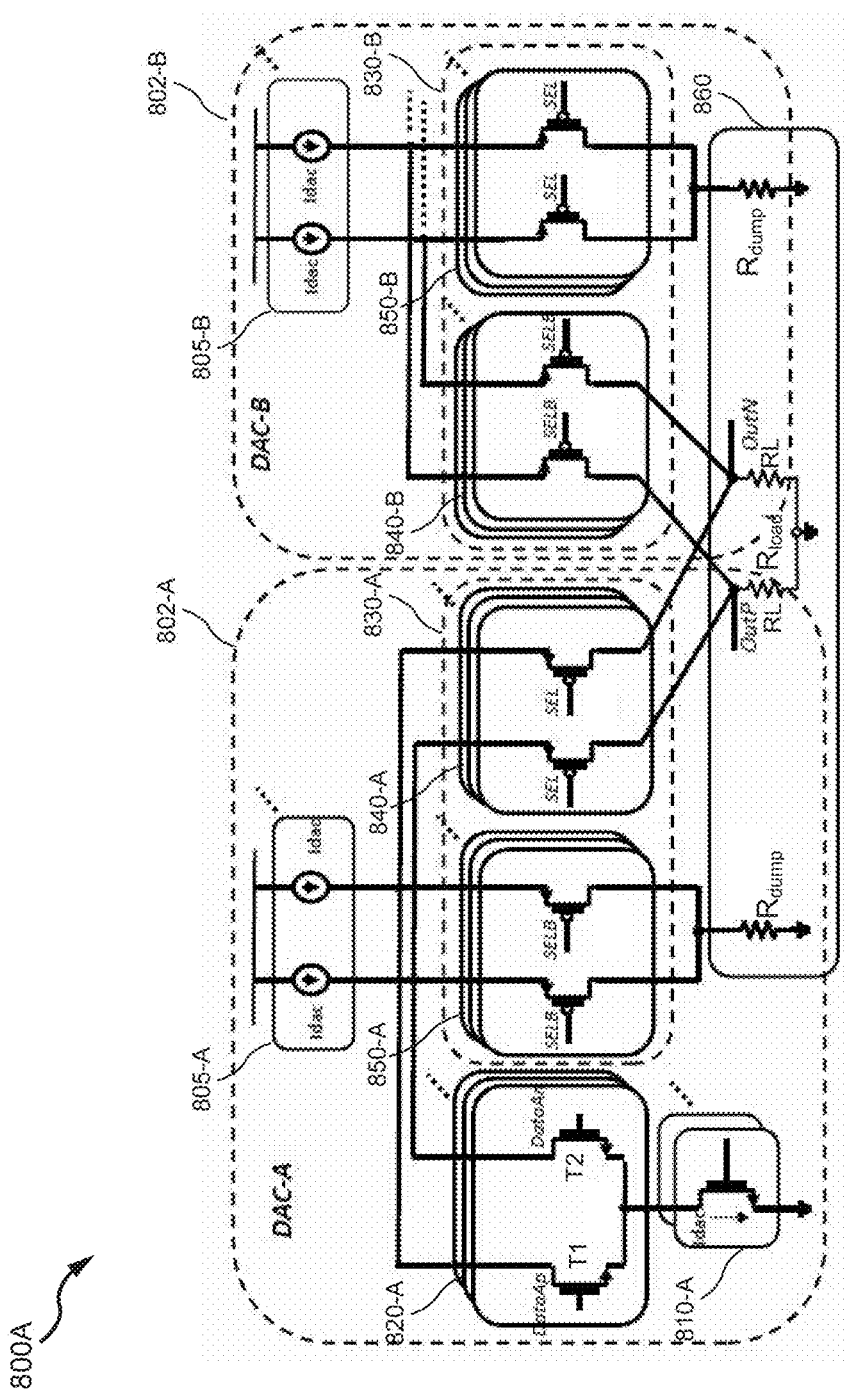
FIG. 8A is a schematic diagram illustrating an example of an interleaved current steering DAC driver.

FIG. 8A is a schematic diagram illustrating an example of an interleaved current steering DAC driver 800A. The interleaved current steering DAC driver 800A may be utilized in DAC systems 100 and 700 of FIGS. 1 and 7. The description from FIG. 7 generally applies to FIG. 8A, with examples of differences between FIG. 7 and FIG. 8A and other description provided herein for purposes of clarity and simplicity. Some of the descriptions provided above with respect to FIGS. 1 through 6 may apply to FIG. 8A. The current steering DAC driver 800A includes two or more current DAC sub-drivers 802A and 802-B summed through one common load resistive network, represented by $R_{load}$. With reference to FIG. 7, DAC driver 802A may encompass DAC sub-drivers 730-A and the switch 750-A of the interleaver circuit 750 of FIG. 7, and DAC driver 802B may encompass DAC sub-drivers 730-B and the switch 750-B of the interleaver circuit 750.

DAC driver 802-A includes sets of data switches 820-A, tail current sources 810-A, sets of second current sources 805A, interleaving (IL) blocks 830A and sets of second current sources 805B and shares a dump and load network 860 with DAC driver 802-B. In one or more implementations, the number of sets of data switches 820-A is (a) equal to the number of interleaving blocks 830-A, (b) equal to the number of tail current sources 810-A, and (c) equal to the number of sets of second current sources 805A. Simply for purposes of brevity, FIG. 8 shows three sets of data switches 820-A, three interleaving blocks 830-A, one set of second current sources 805A, and two tail current sources 810-A, and does not show other data switches, interleaving blocks, second current sources and tail current sources for DAC driver 420-A. In each set of data switches 820-A, one data switch (T1) receives at a first gate terminal a DataAp signal, and another data switch (T2) receives at a second gate terminal a DataAn signal.

Similar to DAC driver 802-A, DAC driver 802-B includes sets of data switches (similar to 820-A, not shown for simplicity), tail current sources (similar to 810-A, not shown for simplicity), interleaving blocks 830-B and sets of second current sources 805-B and shares the dump and load network 860 with the DAC driver 802-A. Similar to DAC driver 802-A, in DAC driver 802-B the number of sets of data switches (not shown) is (a) equal to the number of interleaving blocks 840-B, (b) equal to the number of tail current sources (not shown) and (c) equal to the number of the sets of the second current sources 805-B.

In one or more implementations, the shared dump and load network 860 includes two dump resistor $R_{dump}$ (one for DAC driver 802-A and one for DAC driver 802-B) and a common load network $R_{dump}$ formed of two resistors RL.

The sets of data switches (e.g., 820-A) are in a folded configuration relative to the interleaving blocks (e.g., 830-A). In an aspect, each set of data switches (e.g., 820-A) includes two data switches (e.g., T1 and T2). Each set of data switches (e.g., 820-A) is connected to a respective interleaving block (e.g., 830-A), a respective tail current source (e.g., 810-A) and a respective set of second current sources (e.g., 805-A). A set of drain nodes of each set of data switches (e.g., e.g., T1 and T2) is connected to its respective interleaving block (e.g., 830-A), and its respective set of second current sources (e.g., 805-A). A source node of each set of data switches (e.g., e.g., T1 and T2) couples the set of data switches to its respective tail current source (e.g., 810-A).

The interleaving blocks, for each of DAC driver 802-A and DAC driver 802-B, include dump switches (e.g., 850-A and 850-B) and output switches (e.g., 840-A and 840-B). Each interleaving block contains its respective set of dump switches and its respective set of output switches. Each set of dump switches (e.g., 850-A) includes two dump switches. Each set of output switches (e.g., 840-A) includes two output switches.

The dump switches 850-A and 850-B are connected to the respective dump resistors ($R_{dump}$), and may couple the data switches (e.g., 820-A) to the respective dump resistor ($R_{dump}$). The output switches (840-A and 840-B) are connected to the one common load network ($R_{load}$) including two resistors RL, and may couple the data switches (e.g., 820A) to the common load network. In an aspect, each of DAC driver 802-A and DAC driver 802-B includes N sets of (two) data switches, N interleaving blocks (e.g., N sets of (two) dump switches and N sets of (two) output switches), N tail current sources, and N sets of (two) second current sources, where N the number of input data lines of the DAC system 800A.

A dump network may include one or more resistors ($R_{dump}$). In one aspect, a dump network may also include reactive components. In one aspect, a dump network may be formed by one or more transistors. A load network may include one or more resistors (RL). In one aspect, a load network may also include reactive components. In one aspect, a load network may be formed by one or more transistors.

Figure 8B:
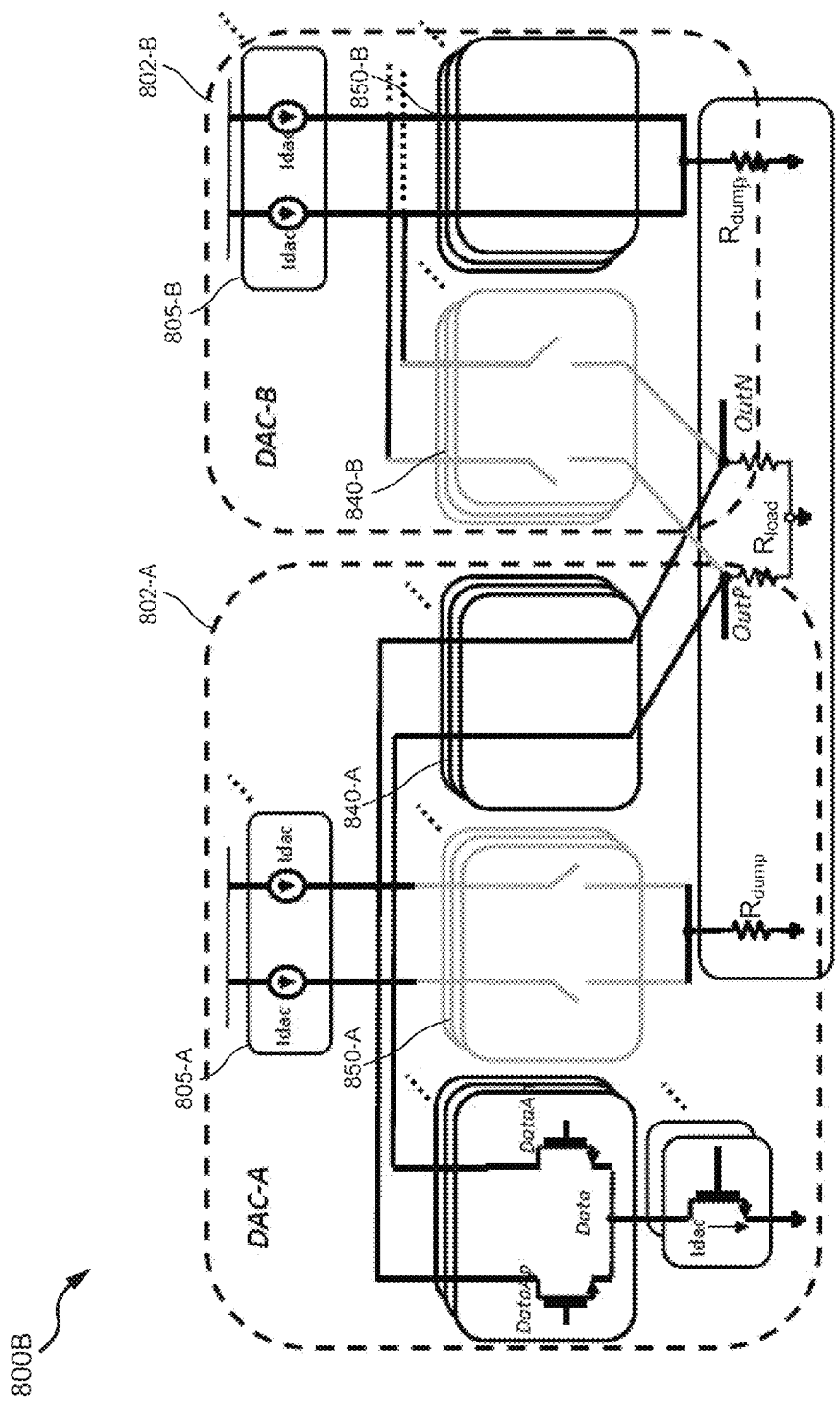
FIG. 8B is a schematic diagram illustrating an example of a first phase of operation of the interleaved current steering DAC driver of FIG. 8.

FIG. 8B is a schematic diagram illustrating an example of a first phase of operation 800-B of the interleaved current steering DAC driver 800A of FIG. 8A. In an aspect, FIG. 8B illustrates a case in which DAC driver 802-A is active and DAC driver 802-B is inactive. When DAC driver 802-A is active, the output switches 840-A, which can selectively connect the sets of data switches 820-A to the load network, are in an on state, and the dump switches 850-A, which can selectively connect the sets of data switches 820-A to the dump network (e.g., $R_{dump}$), are in an off state. When DAC driver 802-B is inactive, the output switches 840-B, which can selectively connect the sets of data switches of DAC driver 420-B to the load network, are in an off state, and the dump switches 850-B, which can selectively connect the sets of data switches of DAC driver 802-B to the dump network (e.g., $R_{dump}$) of DAC driver 802-B, are in an on state. In the phase of operation 800B, the second current sources 805-A provide current passing to the load network $R_{load}$ as well as the data switches 820-A.

Figure 8C:
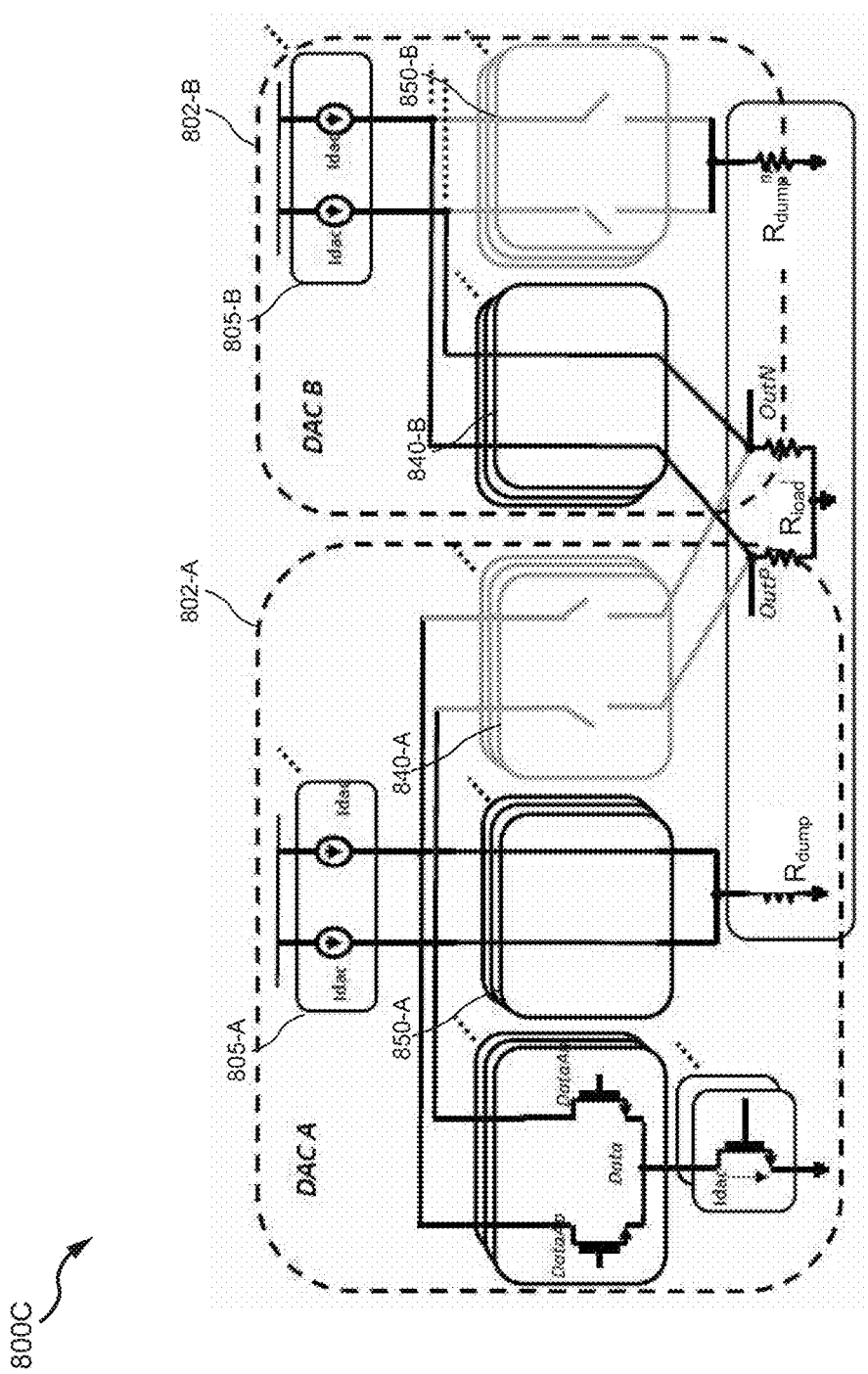
FIG. 8C is a schematic diagram illustrating an example of a second phase of operation of the interleaved current steering DAC driver of FIG. 8.

FIG. 8C is a schematic diagram illustrating an example of another phase of operation 800C of the interleaved current steering DAC driver 800A of FIG. 8A. In an aspect, FIG. 8C illustrates a case in which DAC driver 802-A is inactive and DAC driver 802-B is active. In such a case, the sets of data switches 820-A are selectively connected to the dump network (e.g., $R_{dump}$) of DAC driver 802-A and not connected to the common load network, whereas the sets of data switches of DAC driver 802-B (not shown for simplicity) are connected to the common load network and not connected to the dump network (e.g., $R_{dump}$) of DAC driver 802-B. In the phase of operation 800C, the second current sources 805-B provide current passing to the load network $R_{load}$ as well as the data switches of the DAC driver 802-B (not shown for simplicity).

Although the interleaving factor is equal to two in FIGS. 7, 8A, 8B and 8C, a current steering DAC driver may include more than two sub-drivers. For instance, in addition to DAC driver 802-A and DAC driver 802-B, the current steering DAC driver 800A may also include sub-drivers 802-C and 802-D (not shown in FIG. 8A). Each of sub-drivers 802-C and 802-D may include similar components (e.g., data switches, dump switches, output switches, tail current sources, second current sources) as each of DAC driver 802-A and DAC driver 802-B. Each of 802-C and 802-D may include a respective dump network. DAC driver 802-A, DAC driver 802-B, DAC driver 802-C and DAC driver 802-D may share the same common load network. In an aspect, the number of clock signals utilized may be equal to the interleaving factor. At any time instant, the clock signals may cause one of the four sub-drivers to be active (e.g., supply current to the common load network) and the remaining three sub-drivers to be inactive (e.g., supply current to their respective dump network). In this case, the clock signals may cause each of the sub-drivers to be active 25% of the time and inactive the remaining 75% of the time. In an aspect, the number of sub-drivers may be increased to facilitate higher sampling rate $F_s$ for the DAC system 700 of FIG. 7.

In one or more implementations, the subject technology may be applicable to not only differential inputs (e.g., datap and datan) but also a single-ended input.

Figure 9:
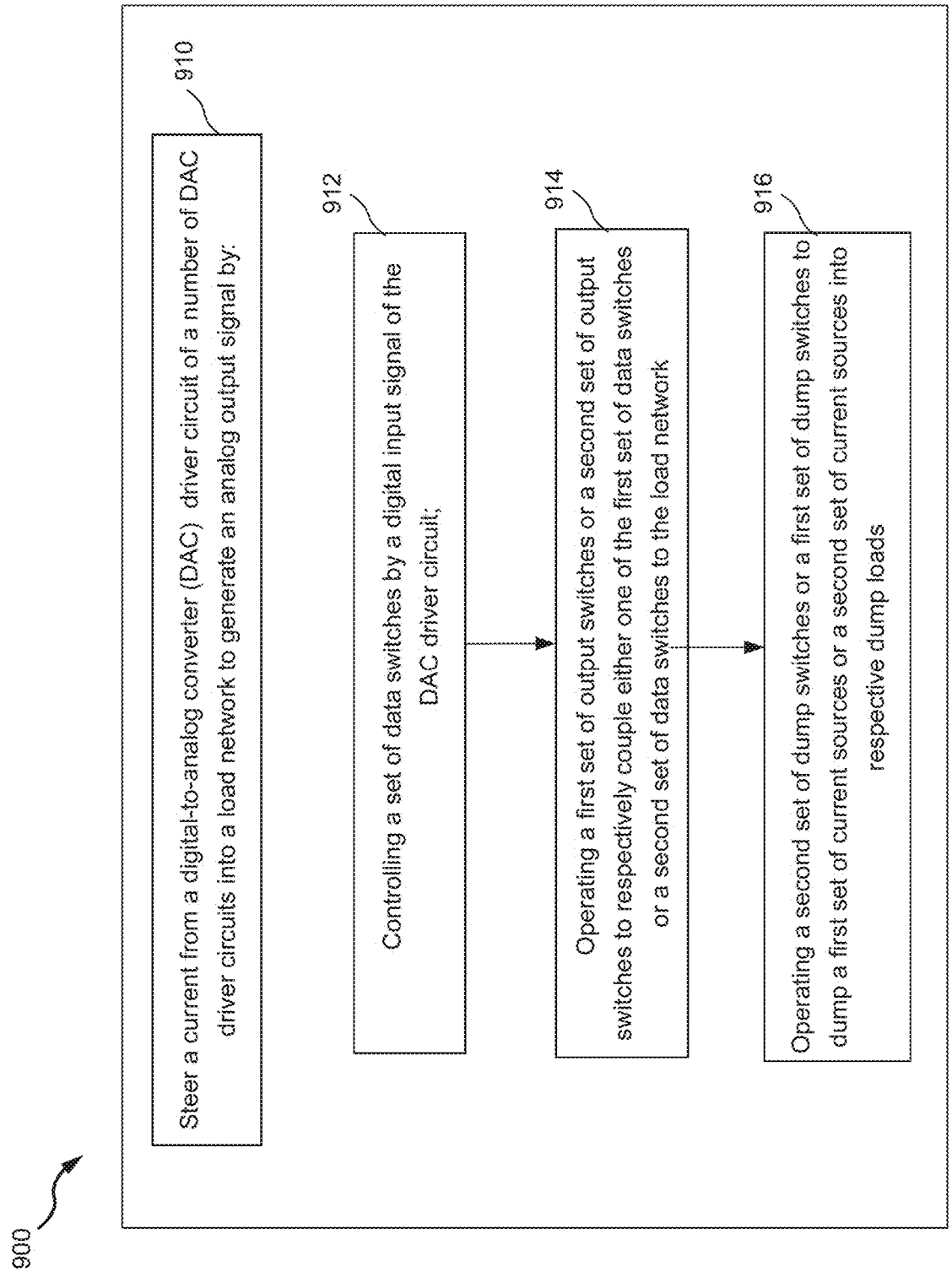
FIG. 9 illustrates an example method of operating an interleaved current steering DAC driver.

FIG. 9 illustrates an example method 900 of operating an interleaved current steering DAC driver (e.g., 800A of FIG. 8A). The method 900 includes steering a current from a DAC driver circuit (e.g., 802A of FIG. 8A) of a number of DAC driver circuits into a load network (e.g., $R_{load}$ of FIG. 8A) to generate an analog output signal (e.g., OutP and OutN of FIG. 8A). Steering the current includes controlling a first set of data switches (e.g., 820A of FIG. 8A) by a first digital input signal (e.g., DataAp and DataAn of FIG. 8A) of the DAC driver circuit of the plurality of DAC driver circuits, operating a first set of output switches (e.g., 840A of FIG. 8A) or a second set of output switches (e.g., 840B of FIG. 8A) to respectively couple either one of the first set of data switches or a second set of data switches (not shown for simplicity) to the load network and operating a first set of dump switches (e.g., 850A of FIG. 8A) or a second set of dump switches (e.g., 850B of FIG. 8A) to dump a first set of current sources (e.g., 805A of FIG. 8A) or a second set of current sources (e.g., 805B of FIG. 8A) into respective dump loads. The steered current is provided by one of the first set of current sources or the second set of current sources. The first set of output switches, the first set of dump switches and the first set of current sources belong to the DAC driver circuit of a plurality of DAC driver circuits. The second set of output switches, the second set of dump switches and the second set of current sources belong to another DAC driver circuit (e.g., 802B of FIG. 8A) of a plurality of DAC driver circuits.

Various examples of aspects of the disclosure are described below as clauses for convenience. These are provided as examples, and do not limit the subject technology.

Clause A: A digital-to-analog converter (DAC) driver apparatus includes a load network and a number of DAC driver circuits coupled to the load network. Each DAC driver circuit includes a first set of data switches that can be controlled by a first digital input signal. The first DAC driver circuit further includes a first set of output switches, a first set of dump switches and a first set of current sources. Another DAC driver circuit of the plurality of DAC driver circuits includes a second set of output switches, a second set of dump switches, and a second set of current sources. The first set of output switches or the second set of output switches are operable to respectively couple either one of the first set of data switches or the first set of current sources to the load network. The first set of dump switches or the second set of dump switches are operable to respectively dump the first set of current sources or the second set current sources into a respective dump load.

Clause B: A method of current steering in a digital-to-analog converter (DAC) driver apparatus includes steering a current from a DAC driver circuit of a number of DAC driver circuits into a load network to generate an analog output signal. Steering the current includes controlling a first set of data switches by a first digital input signal of the DAC driver circuit of the plurality of DAC driver circuits, operating a first set of output switches or a second set of output switches to respectively couple either one of the first set of data switches or a second set of data switches to the load network and operating a first set of dump switches or a second set of dump switches to dump a first set of current sources or a second set of current sources into respective dump loads. The steered current is provided by one of the first set of current sources or the second set of current sources. The first set of output switches, the first set of dump switches and the first set of current sources belong to the DAC driver circuit of a plurality of DAC driver circuits. The second set of output switches, the second set of dump switches and the second set of current sources belong to another DAC driver circuit of a plurality of DAC driver circuits.

Clause C: A digital-to-analog converter (DAC) system includes a clock generator configured to generate a clock signal. A digital signal processor can generate a first digital signal at a first bit rate. A multiplexer circuit can receive the first digital signal and can generate a second digital signal at a second bit rate. Each DAC driver block can generate an analog output signal based on the second digital signal and the clock signal. The DAC driver block includes a plurality of DAC driver circuits coupled to a load network. Each DAC driver circuit of the plurality of DAC driver circuits comprises a first and a second interleaving circuits. Each of the first and the second interleaving circuits includes a set of data switches coupled to a set of dump switches and a set of output switches. The set of dump switches are operable to couple data switches of the first or the second interleaving circuit to a dump network. The set of output switches are operable to couple data switches of the first or the second interleaving circuit to the load network.

A method comprising one or more methods, operations or portions thereof described herein.

An apparatus comprising means adapted for performing one or more methods, operations or portions thereof described herein.

A hardware apparatus comprising circuits configured to perform one or more methods, operations or portions thereof described herein.

An apparatus comprising means adapted for performing one or more methods, operations or portions thereof described herein.

An apparatus comprising components operable to carry out one or more methods, operations or portions thereof described herein.

In one aspect, a method may be an operation, an instruction, or a function and vice versa. In one aspect, a clause may be amended to include some or all of the words (e.g., instructions, operations, functions, or components) recited in other one or more clauses, one or more words, one or more sentences, one or more phrases, one or more paragraphs, and/or one or more claims. During prosecution, one or more claims may be amended to depend on one or more other claims, and one or more claims may be amended to delete one or more limitations.

A reference to an element in the singular is not intended to mean one and only one unless specifically so stated, but rather one or more. For example, "a" module may refer to one or more modules. An element proceeded by "a," "an," "the," or "said" does not, without further constraints, preclude the existence of additional same elements.

Headings and subheadings, if any, are used for convenience only and do not limit the invention. The word exemplary is used to mean serving as an example or illustration. To the extent that the term include, have, or the like is used, such term is intended to be inclusive in a manner similar to the term comprise as comprise is interpreted when employed as a transitional word in a claim. Relational terms such as first and second and the like may be used to distinguish one entity or action from another without necessarily requiring or implying any actual such relationship or order between such entities or actions.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A phrase "at least one of" preceding a series of items, with the terms "and" or "or" to separate any of the items, modifies the list as a whole, rather than each member of the list. The phrase "at least one of" does not require selection of at least one item; rather, the phrase allows a meaning that includes at least one of any one of the items, and/or at least one of any combination of the items, and/or at least one of each of the items. By way of example, each of the phrases "at least one of A, B, and C" or "at least one of A, B, or C" refers to only A, only B, or only C; any combination of A, B, and C; and/or at least one of each of A, B, and C.

In one aspect, a transistor may be a bipolar junction transistor (BJT), and it may refer to any of a variety of multi-terminal transistors generally operating on the principal of carrying current using both electrons and holes, including but not limited to an n-p-n BJT and a p-n-p BJT.

In one aspect, a transistor may be a field effect transistor (FET), and it may refer to any of a variety of multi-terminal transistors generally operating on the principals of controlling an electric field to control the shape and hence the conductivity of a channel of one type of charge carrier in a semiconductor material, including, but not limited to a metal oxide semiconductor field effect transistor (MOSFET), a junction FET (JFET), a metal semiconductor FET (MESFET), a high electron mobility transistor (HEMT), a modulation doped FET (MODFET), an insulated gate bipolar transistor (IGBT), a fast reverse epitaxial diode FET (FREDFET), and an ion-sensitive FET (ISFET).

In one aspect, the terms base, emitter, and collector may refer to three terminals of a transistor and may refer to a base, an emitter and a collector of a bipolar junction transistor or may refer to a gate, a source, and a drain of a field effect transistor, respectively, and vice versa. In another aspect, the terms gate, source, and drain may refer to base, emitter, and collector of a transistor, respectively, and vice versa.

Unless otherwise mentioned, various configurations described in the present disclosure may be implemented on a Silicon, Silicon-Germanium (SiGe), Gallium Arsenide (GaAs), Indium Phosphide (InP) or Indium Gallium Phosphide (InGaP) substrate, or any other suitable substrate.

It is understood that the specific order or hierarchy of steps, operations, or processes disclosed is an illustration of exemplary approaches. Unless explicitly stated otherwise, it is understood that the specific order or hierarchy of steps, operations, or processes may be performed in different order. Some of the steps, operations, or processes may be performed simultaneously. The accompanying method claims, if any, present elements of the various steps, operations or processes in a sample order, and are not meant to be limited to the specific order or hierarchy presented. These may be performed in serial, linearly, in parallel or in different order.

In one aspect, a term coupled or the like may refer to being directly coupled. In another aspect, a term coupled or the like may refer to being indirectly coupled.

Terms such as top, bottom, front, rear, side, horizontal, vertical, and the like refer to an arbitrary frame of reference, rather than to the ordinary gravitational frame of reference. Thus, such a term may extend upwardly, downwardly, diagonally, or horizontally in a gravitational frame of reference.

The disclosure is provided to enable any person skilled in the art to practice the various aspects described herein. In some instances, well-known structures and components are shown in block diagram form in order to avoid obscuring the concepts of the subject technology. The disclosure provides various examples of the subject technology, and the subject technology is not limited to these examples. Various modifications to these aspects will be readily apparent to those skilled in the art, and the principles described herein may be applied to other aspects.

All structural and functional equivalents to the elements of the various aspects described throughout the disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for".

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

What is claimed is:
1. A system, comprising:
a clock generator configured to generate a clock signal;
a multiplexer circuit configured to receive a first signal and to generate a second signal; and a digital-to-analog converter (DAC) driver apparatus comprising a plurality of DAC driver circuits, the DAC driver apparatus configured to generate an analog output signal based on the second signal and the clock signal, wherein:
  a DAC driver circuit of the plurality of DAC driver circuits comprises a first interleaving circuit and a second interleaving circuit;
  each of the first and the second interleaving circuits comprises data switches coupled to dump switches and output switches;
  the dump switches are configured to connect the data switches of the first or the second interleaving circuit to a dump network; and
  the output switches are configured to connect the data switches of the first or the second interleaving circuit to a load network.

2. The system of claim 1, wherein:
in a first phase of the clock signal, the dump switches of the first interleaving circuit are configured to connect the data switches of the first interleaving circuit to the dump network, and the output switches of the second interleaving circuit are configured to connect the data switches of the second interleaving circuit to the load network.

3. The system of claim 1, wherein:
in a second phase of the clock signal, the dump switches of the second interleaving circuit are configured to connect the data switches of the second interleaving circuit to the dump network, and the output switches of the first interleaving circuit are configured to connect the data switches of the first interleaving circuit to the load network.

4. The system of claim 1, wherein:
the output switches of the first and the second interleaving circuits are coupled through respective tail transistors to a ground potential; and
the dump switches and the output switches of the first and the second interleaving circuit and the respective tail transistors are implemented using metal-oxide semiconductor (MOS) transistors.

5. An apparatus, comprising:
a plurality of digital-to-analog converter (DAC) driver circuits comprising a first DAC driver circuit and a second DAC driver circuit; and
a load network,
wherein the first DAC driver circuit comprises first data switches, first output switches, first dump switches, and first current sources,
wherein the second DAC driver circuit comprises second output switches, second dump switches, and second current sources,
wherein the first output switches or the second output switches are configured to respectively connect either one of the first data switches or the second current sources to the load network, and
wherein the first dump switches or the second dump switches are configured to respectively dump the first current sources or the second current sources into a dump load.

6. The apparatus of claim 5, wherein the first output switches are configured to connect the first data switches to the load network in a first phase and to disconnect the first data switches from the load network in a second phase that is different from the first phase.

7. The apparatus of claim 6, wherein the first dump switches are configured to disconnect the first current sources from a first dump load in the first phase and to connect the first current sources to the first dump load in the second phase.

8. The apparatus of claim 7, wherein the second dump switches are configured to connect the second current sources to a second dump load in the first phase and to disconnect the second current sources from the second dump load in the second phase.

9. The apparatus of claim 8, wherein the load network comprises a pair of load resistors, wherein each of the first dump load and the second dump load has a resistance no exceeding a half of a resistance of each of the pair of load resistors.

10. The apparatus of claim 5, wherein:
the first data switches are configured to be controlled by an input signal;
a count N of the plurality of DAC driver circuits is equal to or greater than a number of bits of the input signal; and
N is an integer.

11. The apparatus of claim 5, wherein an analog output signal of the first DAC driver circuit is accessible from an output port of the first DAC driver circuit coupled to the load network.

12. The apparatus of claim 5, wherein:
the first data switches comprise a pair of transistors;
the pair of transistors comprises metal-oxide semiconductor (MOS) transistors; and
the pair of transistors are coupled to a DAC tail current source and the first output switches.

13. The apparatus of any of claim 5, wherein:
the first and the second output switches and the first and the second dump switches are implemented using transistor pairs; and
the transistor pairs comprise MOS transistors.

14. The apparatus of claim 5, wherein:
the first data switches, the first and the second output switches and the first and the second dump switches are implemented using thin-oxide transistors; and
an oxide thickness of the thin-oxide transistors is within a range of about 0.1 Angstrom to 10 Angstrom.

15. A method for current steering in a digital-to-analog converter (DAC) apparatus, wherein the DAC apparatus comprises a plurality of DAC driver circuits, wherein the plurality of DAC driver circuits comprises a DAC driver circuit, wherein the plurality of DAC driver circuits comprises first data switches, first output switches, second output switches, first dump switches, second dump switches, first current sources, and second current sources, and wherein the method comprises:
  supplying a digital input signal to the first data switches of the plurality of DAC driver circuits;
  operating the first output switches or the second output switches to respectively couple either one of the first data switches or the second current sources to a load network; and
  operating the first dump switches or the second dump switches to steer current from the first current sources or the second current sources into a respective dump load.

16. The method of claim 15, comprising:
  operating the first output switches to couple the first data switches to the load network in a first phase and to decouple the first data switches from the load network in a second phase.

17. The method of claim 16, comprising:
operating the first dump switches to decouple the first current sources from a first dump load in the first phase and to couple the first current sources to the first dump load in the second phase.

18. The method of claim 17, comprising:
operating the second dump switches to couple the second current sources to a second dump load in the first phase and to decouple the second current sources from the second dump load in the second phase.

19. The method of claim 15, wherein:
the DAC driver circuit comprises the first data switches configured to receive the digital input signal;
the DAC driver circuit is configured to generate an analog output signal; and
the analog output signal is different from the digital input signal.

20. The method of claim 19, comprising:
accessing the analog output signal from an output port of the DAC driver circuit coupled to the load network.

* * * * *